US012776379B2

(12) United States Patent
Zhou et al.

(10) Patent No.: US 12,776,379 B2
(45) Date of Patent: Oct. 27, 2026

(54) MEMORY DEVICES AND PROGRAM OPERATIONS HAVING ADJUSTED PREPULSE THEREOF

(71) Applicant: YANGTZE MEMORY TECHNOLOGIES CO., LTD., Wuhan (CN)

(72) Inventors: Xufeng Zhou, Wuhan (CN); Zhipeng Dong, Wuhan (CN); Ke Liang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 139 days.

(21) Appl. No.: 18/631,743

(22) Filed: Apr. 10, 2024

(65) Prior Publication Data

US 2025/0292845 A1 Sep. 18, 2025

Related U.S. Application Data

(63) Continuation of application No. PCT/CN2024/081216, filed on Mar. 12, 2024.

(51) Int. Cl.
*G11C 16/34* (2006.01)
*G11C 11/56* (2006.01)
(Continued)

(52) U.S. Cl.
CPC ...... *G11C 16/3459* (2013.01); *G11C 11/5628* (2013.01); *G11C 16/0433* (2013.01);
(Continued)

(58) Field of Classification Search
CPC . G11C 16/3459; G11C 16/0433; G11C 16/08; G11C 16/102; G11C 2211/5621;
(Continued)

(56) References Cited

U.S. PATENT DOCUMENTS

2016/0012898 A1* 1/2016 Shim .................. G11C 16/3427 365/185.17
2018/0053554 A1* 2/2018 Nam ...................... G11C 16/28
(Continued)

OTHER PUBLICATIONS

International Search Report issued in corresponding International Application No. PCT/CN2024/081216 mailed on Jul. 25, 2024, 3 pages.

*Primary Examiner* — Alexander Sofocleous
*Assistant Examiner* — Joseph Fidelis Stormes
(74) *Attorney, Agent, or Firm* — BAYES PLLC

(57) ABSTRACT

The present disclosure provides memory devices, memory systems, and methods for operating a memory device. In certain aspects, a disclosed memory device comprises memory strings each comprising a drain select gate (DSG) transistor, memory cells, and a source select gate (SSG) transistor, the method comprising: programming a first memory cell of a first memory string in a subset of memory strings, wherein the SSG transistors of the subset of memory strings are coupled with each other. In certain aspects, a disclosed method for operating the disclosed memory device comprises verifying the first memory cell without applying a pre-pulse stage to the first memory cell, programming a second memory cell of a second memory string in the subset after programming the first memory cell, and verifying the second memory cell including applying the pre-pulse stage to the second memory cell.

20 Claims, 14 Drawing Sheets

(51) Int. Cl.

| | |
|---|---|
| ***G11C 16/04*** | (2006.01) |
| ***G11C 16/08*** | (2006.01) |
| ***G11C 16/10*** | (2006.01) |
| ***G11C 16/24*** | (2006.01) |
| ***H10B 41/35*** | (2023.01) |
| ***H10B 41/41*** | (2023.01) |
| ***H10B 43/35*** | (2023.01) |
| ***H10B 43/40*** | (2023.01) |

(52) U.S. Cl.

CPC .......... *G11C 16/0483* (2013.01); *G11C 16/08* (2013.01); *G11C 16/10* (2013.01); *G11C 16/102* (2013.01); *G11C 16/24* (2013.01); *H10B 41/35* (2023.02); *H10B 41/41* (2023.02); *H10B 43/35* (2023.02); *H10B 43/40* (2023.02); *G11C 2211/5621* (2013.01)

(58) Field of Classification Search

CPC ..... G11C 11/5628; G11C 16/10; G11C 16/24; G11C 16/0483

See application file for complete search history.

(56) References Cited

U.S. PATENT DOCUMENTS

| | | | | |
|---|---|---|---|---|
| 2018/0218775 | A1* | 8/2018 | Kim | G11C 11/5635 |
| 2023/0132781 | A1 | 5/2023 | Liu et al. | |
| 2024/0071544 | A1* | 2/2024 | Zainuddin | G11C 11/5628 |

* cited by examiner

102

MEMORY DEVICES AND PROGRAM OPERATIONS HAVING ADJUSTED PREPULSE THEREOF

CROSS-REFERENCE TO RELATED APPLICATIONS

This application is a continuation of International Application No. PCT/CN2024/081216, filed on Mar. 12, 2024, entitled "MEMORY DEVICES AND PROGRAM OPERATIONS THEREOF," which is incorporated herein by reference in its entirety.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase. For NAND Flash memory, an erase operation can be performed at the block level, and a program operation or a read operation can be performed at the page level.

SUMMARY

In one aspect, the present disclosure provides a method for operating a memory device, the memory device comprising memory strings each comprising a drain select gate (DSG) transistor, memory cells, and a source select gate (SSG) transistor, the method comprising: programming a first memory cell of a first memory string in a subset of memory strings, wherein the SSG transistors of the subset of memory strings are coupled with each other; verifying the first memory cell without applying a pre-pulse stage to the first memory cell; programming a second memory cell of a second memory string in the subset after programming the first memory cell; and verifying the second memory cell including applying the pre-pulse stage to the second memory cell.

In some implementations, the method further comprises: programming a third memory cell of a third memory string in the subset after programming the first memory string; and verifying the third memory cell including applying the pre-pulse stage to the third memory cell.

In some implementations, verifying the first memory cell comprises: turning on the SSG transistors of the subset of memory strings and the DSG transistor of the first memory string; keeping the SSG transistors of the memory strings other than the subset of memory strings off during verifying the first memory cell; and keeping the DSG transistors of the memory strings other than the first memory string off during verifying the first memory cell.

In some implementations, verifying the first memory cell further comprises: applying a pass voltage to unselect word lines during verifying the first memory cell; and after the unselect word lines reaching the pass voltage, applying verify voltages to a select word line during verifying the first memory cell.

In some implementations, verifying the second memory cell comprises: turning on the SSG transistors of the subset of memory strings and the DSG transistor of the second memory string; turning on the SSG transistors of the memory strings other than the subset of memory strings in the pre-pulse stage of verifying the second memory cell; and turning on the DSG transistors of the memory strings other than the second memory string in the pre-pulse stage of verifying the second memory cell.

In some implementations, verifying the second memory cell further comprises: applying the pass voltage to unselect word lines in the pre-pulse stage verifying the second memory cell; and after the pre-pulse stage, applying verify voltages to the select word line during verifying the second memory cell.

In some implementations, a first time period of the unselect word lines reaching the pass voltage during verifying the first memory cell is less than a second time period of the unselect word lines reaching the pass voltage during verifying the second memory cell.

In some implementations, the method further comprises: providing a same voltage to the SSG transistors of the subset of memory strings that are coupled with each other.

In some implementations, the first memory cell and the second memory cell are coupled with a same word line.

In some implementations, a first time interval between turning on the DSG transistor of the first memory string and applying a first verify voltage to the select word line is less than a second time interval between turning on the DSG transistor of the second memory string and applying the first verify voltage to the select word line.

Another aspect of the present disclosure provides a method for operating a memory device, comprising: applying a first voltage to a first DSG transistor in a first memory string during a first verifying operation of a first memory cell in the first memory string; applying a second voltage lower than the first voltage to a second DSG transistor in a second memory string before applying a verify voltage to a word line coupled with the first memory cell during the first verifying operation; applying the first voltage to the second DSG transistor in the second memory string during a pre-pulse stage of a second verifying operation of a second memory cell in the second memory string and coupled with the word line; and applying a third voltage higher than the second voltage to the first DSG transistor in the first memory string during the pre-pulse stage, wherein a first SSG transistor of the first memory string and a second SSG transistor of the second memory string are coupled with each other, the first verifying operation is before the second verifying operation.

In some implementations, the second voltage makes the second DSG transistor in an off state; and the third voltage make the first DSG transistor in an open state.

Another aspect of the present disclosure provides a memory device, comprising: memory strings each comprising a drain select gate (DSG) transistor, memory cells, and a source select gate (SSG) transistor; and a peripheral circuit coupled to the memory strings and configured to: program a first memory cell of a first memory string in a subset of the memory strings, wherein the SSG transistors of the subset of memory strings are coupled with each other, verify the first memory cell without applying a pre-pulse stage to the first memory cell, program a second memory cell of a second memory string in the subset after programming the first memory cell, and verify the second memory cell including applying the pre-pulse stage to the second memory cell.

In some implementations, the memory device further comprises: DSG cut structures to isolate the DSG transistors of the memory strings from each other; and SSG cut structures to separate the memory strings into subsets of memory strings, wherein the DSG transistors of the memory strings in each subset are electrically coupled with each other, and the DSG transistors of the memory strings in different subsets are isolated by the SSG cut structures.

In some implementations, the peripheral circuit is further configured to: program a third memory cell in a third memory string in the subset after programming the first memory cell; and verify the third memory cell including applying the pre-pulse stage to the third memory cell.

In some implementations, the peripheral circuit is further configured to: turn on the SSG transistors of the subset of memory strings and the DSG transistor of the first memory string; keep the SSG transistors of the memory strings other than the subset of memory strings off during verifying the first memory cell; and keep the DSG transistors of the memory strings other than the first memory string off during verifying the first memory cell.

In some implementations, the peripheral circuit is further configured to: apply a pass voltage to unselect word lines during verifying the first memory cell; and after the unselect word lines reaching the pass voltage, apply verify voltages to a select word line during verifying the first memory cell.

In some implementations, the peripheral circuit is further configured to: turn on the SSG transistors of the subset of memory strings and the DSG transistor of the second memory string; turn on and turn off the SSG transistors of the memory strings other than the subset of memory strings during the pre-pulse stage of verifying the second memory cell; and turn on and turn off the DSG transistors of the memory strings other than the second memory string during the pre-pulse stage of verifying the second memory cell.

In some implementations, the peripheral circuit is further configured to: apply the pass voltage to unselect word lines in the pre-pulse stage verifying the second memory cell; and after the pre-pulse stage, apply verify voltages to the select word line during verifying the second memory cell.

In some implementations, a first time period of the unselect word lines reaching the pass voltage during verifying the first memory cell is less than a second time period of the unselect word lines reaching the pass voltage during verifying the second memory cell.

In some implementations, the peripheral circuit is further configured to: provide a same voltage to the SSG transistors of the subset of memory strings that are coupled with each other.

In some implementations, the first memory cell and the second memory cell are coupled with a same word line.

In some implementations, a first time interval between turning on the DSG transistor of the first memory string and applying a first verify voltage to the select word line is less than a second time interval between turning on the DSG transistor of the second memory string and applying the first verify voltage to the select word line.

In some implementations, the SSG cut structures are physical cut structures.

In some implementations, the SSG cut structures are electrical cut structures.

Another aspect of the present disclosure provides a system, comprising: a memory device configured to store data, the memory device comprising: memory strings each comprising a drain select gate (DSG) transistor, memory cells, and a source select gate (SSG) transistor; DSG cut structures to isolate the DSG transistors of the memory strings from each other; SSG cut structures to separate the memory strings into subsets of memory strings, wherein the DSG transistors of the memory strings in each subset are electrically coupled with each other, and the DSG transistors of the memory strings in different subsets are isolated by the SSG cut structures; and a peripheral circuit coupled to the memory strings and configured to: program a first memory cell of a first memory string in a subset of the memory strings, wherein the SSG transistors of the subset of memory strings are coupled with each other, verify the first memory cell without applying a pre-pulse stage to the first memory cell, program a second memory cell of a second memory string in the subset after programming the first memory cell, and verify the second memory cell including applying the pre-pulse stage to the second memory cell.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
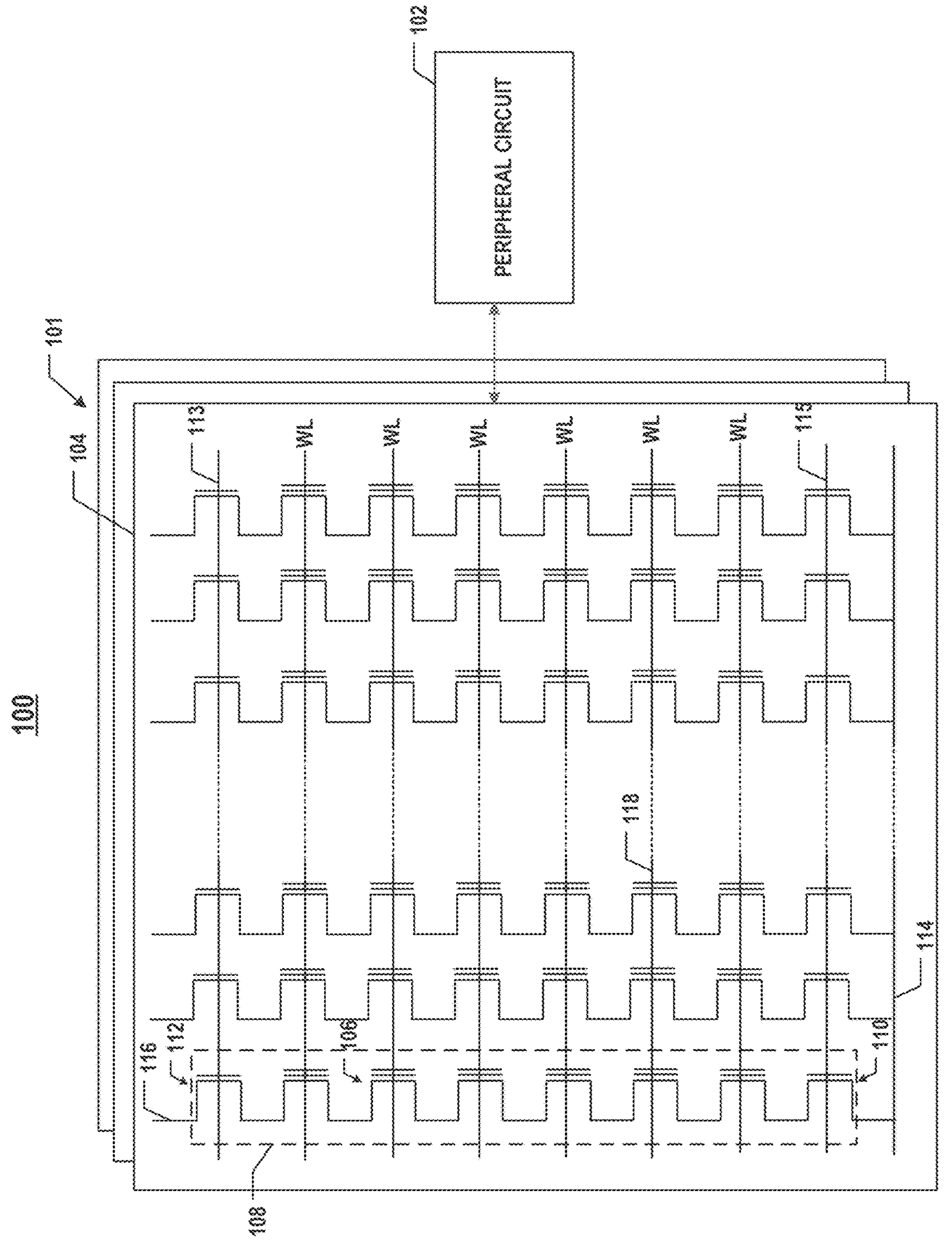
FIG. 1 illustrates a schematic diagram of a memory device including peripheral circuits, according to some aspects of the present disclosure.

The present disclosure will be described with reference to the accompanying drawings.

DETAILED DESCRIPTION

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Memory devices, such as NAND Flash memory devices, can store more than a single bit of information into each memory cell with multiple states in order to increase the storage capacity and reduce the cost per bit. The program operation of a NAND Flash memory device involves a number of program cycles and verify cycles. In order to save program time ($t_{PROG}$), efforts have been mostly made in the industry on how to reduce the number of verify cycles. On the other hand, for each verify cycle, residual channel potential may remain in the channels of memory strings after the respective program cycle, and hot carrier injection (HCI) effect may occur in the channels of the memory strings by applying the verify voltage pulses(s), both of which can adversely affect the subsequent read operation, e.g., by increasing the failure bit count (FBC). Thus, it is a common practice to turn on the channels of memory strings before and after applying verify voltage pulse(s) in the so-called "pre-pulse stage" and "post-pulse stage," respectively, in each verify cycle to "clean" the channels. Those operations during the pre-pulse and post-pulse stages, however, prolong the duration of each verify cycle, thereby becoming the bottleneck of saving program time.

To address one or more of the aforementioned issues, the present disclosure provides separated channel cleaning schemes for different memory strings which would have different channel potentials beginning from the pre-pulse stage during the verify operation. In some implementations, first programmed memory strings can skip the pre-pulse stage and/or the post-pulse stage in the verify cycle and do not clean the channels of memory strings for saving program time. In some implementations, the channel cleaning in both the pre-pulse stage and post-pulse stage of the verify operation can be skipped for the first programmed memory strings. In some other implementations, the channel cleaning is performed in only the post-pulse stages of the verify operation for the first programmed memory strings. The separated channel cleaning schemes disclosed herein can reduce the program time while still mitigating the adverse impacts caused by residual channel potential and the HCI effect.

FIG. 1 illustrates a schematic circuit diagram of a memory device 100 including peripheral circuits, according to some aspects of the present disclosure. Memory device 100 can include a memory cell array 101 and peripheral circuits 102 coupled to memory cell array 101. Memory cell array 101 can be a NAND Flash memory cell array in which memory cells 106 are provided in the form of an array of NAND memory strings 108 each extending vertically above a substrate (not shown). In some implementations, each NAND memory string 108 includes a plurality of memory cells 106 coupled in series and stacked vertically. Each memory cell 106 can hold a continuous, analog value, such as an electrical voltage or charge, which depends on the number of electrons trapped within a region of memory cell 106. Each memory cell 106 can be either a floating gate type of memory cell including a floating-gate transistor or a charge trap type of memory cell including a charge-trap transistor.

In some implementations, each memory cell 106 is a single level cell (SLC) that has two possible levels (memory states) and thus, can store one bit of data. For example, the first level "0" can correspond to a first range of threshold voltages, and the second level "1" can correspond to a second range of threshold voltages. In some implementations, each memory cell 106 is an xLC that is capable of storing more than a single bit of data in more than four levels. For example, the xLC may store two bits per cell (MLC), three bits per cell (TLC), or four bits per cell (QLC). Each xLC can be programmed to assume a range of possible nominal storage values (i.e., corresponding to $2^N$ pieces of N-bits data). In some implementations, at least one of memory cells 106 is set to one of $2^N$ levels corresponding to a piece of N-bits data, where N is an integer greater than 1.

As shown in FIG. 1, each NAND memory string 108 can also include a source select gate (SSG) transistor 110 (a.k.a., bottom select gate (BSG) transistor) at its source end and a drain select gate (DSG) transistor 112 (a.k.a., top select gate (TSG) transistor) at its drain end. SSG transistor 110 and DSG transistor 112 can be configured to activate select NAND memory strings 108 (columns of the array) during read and program operations. In some implementations, the sources of NAND memory strings 108 in the same block 104 are coupled through a same source line (SL) 114, e.g., a common SL. In other words, all NAND memory strings 108 in the same block 104 have an array common source (ACS), according to some implementations. The drain of each NAND memory string 108 is coupled to a respective bit line 116 from which data can be read or written via an output bus (not shown), according to some implementations. In some implementations, each NAND memory string 108 is configured to be selected or deselected by applying a select voltage (e.g., a positive voltage greater than the threshold voltage of DSG transistor 112) or a deselect voltage (e.g., the ground voltage) to the gate of respective DSG transistor 112 through one or more DSG lines 113 and/or by applying a select voltage (e.g., a positive voltage greater than the threshold voltage of SSG transistor 110) or a deselect voltage (e.g., the ground voltage) to the gate of respective SSG transistor 110 through one or more SSG lines 115.

As shown in FIG. 1, NAND memory strings 108 can be organized into multiple blocks 104, each of which can have a common source line 114, e.g., coupled to the ACS. In some implementations, each block 104 is the basic data unit for erase operations, i.e., all memory cells 106 on the same block 104 are erased at the same time. To erase memory cells 106 in a select block 104, source lines 114 coupled to select block 104 as well as unselect blocks 104 in the same plane as select block 104 can be biased with an erase voltage (Vers), such as a high positive bias voltage (e.g., 20 V or more). Memory cells 106 of adjacent NAND memory strings 108 can be coupled through word lines 118 that select which row of memory cells 106 is affected by read and program operations.

As shown in FIG. 1, memory cell array 101 can include an array of memory cells 106 in a plurality of rows and a plurality of columns in each block 104. One column of memory cells corresponds to one NAND memory string 108, according to some implementations. The plurality of rows of memory cells 106 can be respectively coupled to word lines 118, and the plurality of columns of memory cells 106 can be respectively coupled to bit lines 116. Peripheral circuit 102 can be coupled to memory cell array 101 through bit lines 116 and word lines 118.

Figure 2:
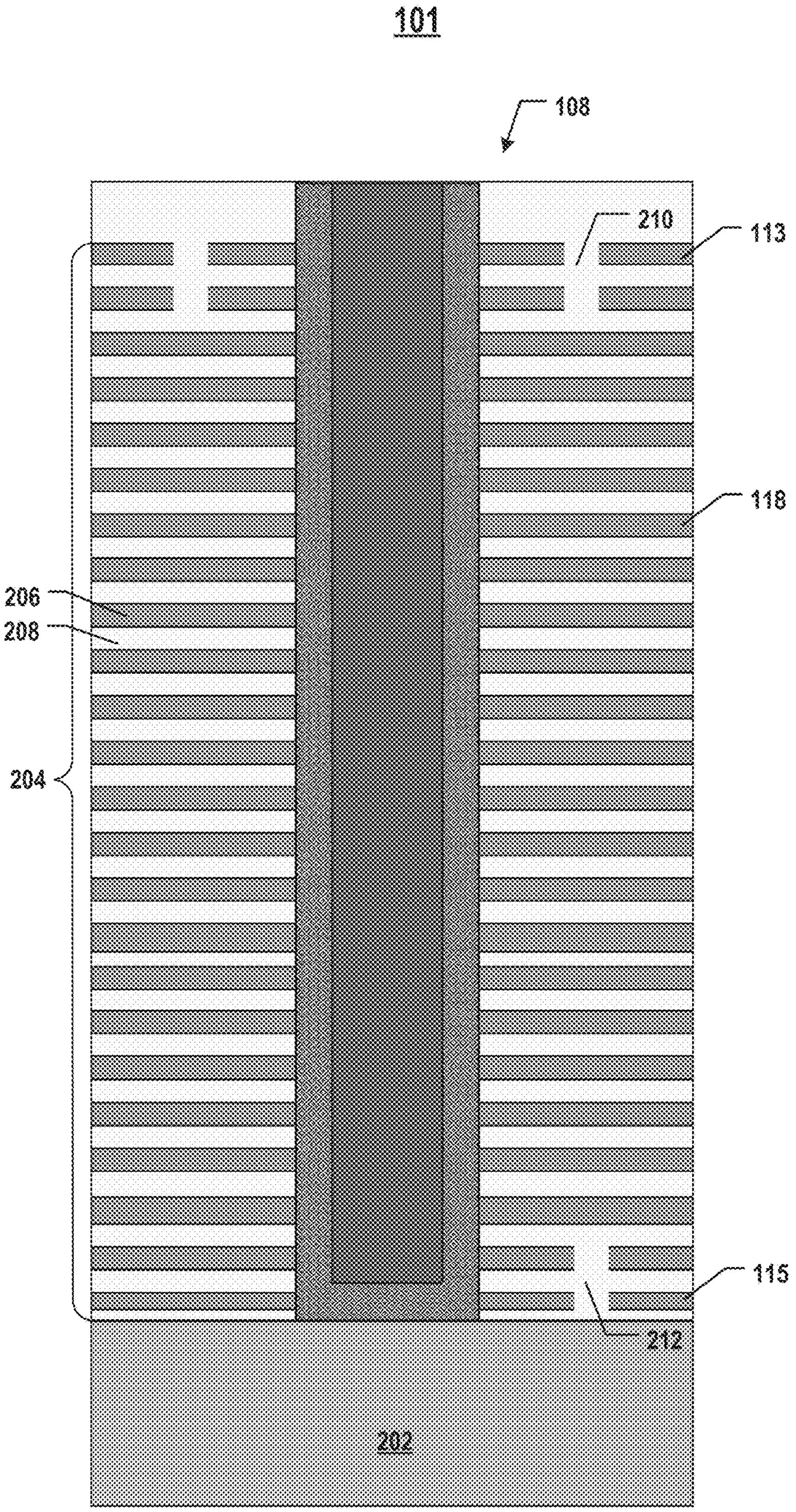
FIG. 2 illustrates a side view of a cross-section of a memory cell array including a NAND memory string, according to some aspects of the present disclosure.

FIG. 2 illustrates a side view of a cross-section of memory cell array 101 including NAND memory string 108, according to some aspects of the present disclosure. As shown in FIG. 2, NAND memory string 108 can extend vertically through a memory stack 204 above a substrate 202. Substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 204 can include interleaved gate conductive layers 206 and gate-to-gate dielectric layers 208. The number of the pairs of gate conductive layers 206 and gate-to-gate dielectric layers 208 in memory stack 204 can determine the number of memory cells 106 in memory cell array 101. Gate conductive layer 206 can include conductive materials including, but not limited to, tungsten (W), cobalt (Co), copper (Cu), aluminum (Al), polysilicon, doped silicon, silicides, or any combination thereof. In some implementations, each gate conductive layer 206 includes a metal layer, such as a tungsten layer. In some implementations, each gate conductive layer 206 includes a doped polysilicon layer. Each gate conductive layer 206 can include control gates surrounding memory cells 106, the gates of DSG transistors 112, or the gates of SSG transistors 110, and can extend laterally as DSG line 113 at the top of memory stack 204, SSG line 115 at the bottom of memory stack 204, or word line 118 between DSG line 113 and SSG line 115.

In some implementations, DSG cuts 210 (a.k.a., TSG cuts) are formed through DSG lines 113, which electrically separate DSG lines 113 between adjacent areas (e.g., "sets" referred to herein), such that DSG lines 113 and DSG transistors 112 in different sets may be individually controlled in read and/or program operations. Similarly, in some implementations, SSG cuts 212 (a.k.a., BSG cuts) are formed through SSG lines 115, which electrically separate SSG lines 115 between adjacent regions (e.g., "fingers" referred to herein), such that SSG lines 115 and SSG transistors 110 in different fingers may be individually controlled in read and/or program operations.

As shown in FIG. 2, NAND memory string 108 includes a channel structure extending vertically through memory stack 204. In some implementations, the channel structure includes semiconductor material(s) (e.g., as a semiconductor channel) and dielectric material(s) (e.g., as a memory film). It is understood that although not shown in FIG. 2, additional components of memory cell array 101 can be formed including, but not limited to, gate line slits/source contacts, local contacts, interconnect layers, etc.

Figure 3:
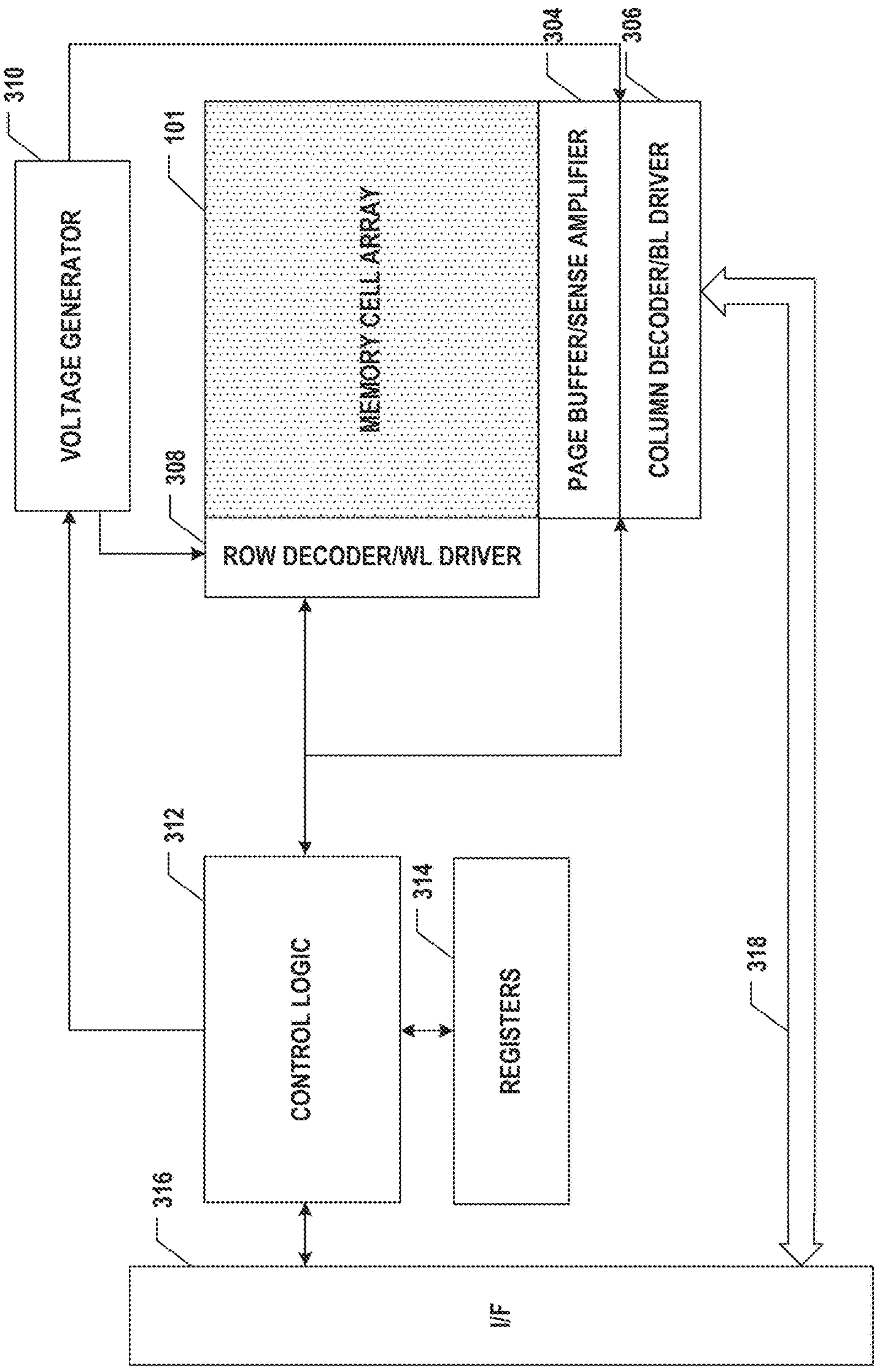
FIG. 3 illustrates a block diagram of a memory device including a memory cell array and peripheral circuits, according to some aspects of the present disclosure.

Referring back to FIG. 1, peripheral circuits 102 can be coupled to memory cell array 101 through bit lines 116, word lines 118, source lines 114, SSG lines 115, and DSG lines 113. Peripheral circuits 102 can include any suitable analog, digital, and mixed-signal circuits for facilitating the operations of memory cell array 101 by applying and sensing voltage signals and/or current signals to and from each select memory cell 106 through bit lines 116, word lines 118, source lines 114, SSG lines 115, and DSG lines 113. Peripheral circuits 102 can include various types of peripheral circuits formed using metal-oxide-semiconductor (MOS) technologies. For example, FIG. 3 illustrates some exemplary peripheral circuits including a page buffer/sense amplifier 304, a column decoder/bit line driver 306, a row decoder/word line driver 308, a voltage generator 310, control logic 312, registers 314, an interface (I/F) 316, and a data bus 318. It is understood that in some examples, additional peripheral circuits not shown in FIG. 3 may be included as well.

Page buffer/sense amplifier 304 can be configured to sense (read) and program (write) data from and to memory cell array 101 according to the control signals from control logic 312. In one example, page buffer/sense amplifier 304 may store one or more pages of program data (write data, referred to herein as "data page") to be programmed into one row of memory cell array 101. In another example, page buffer/sense amplifier 304 may verify programmed select memory cells 106 in each program/verify cycle in a program operation to ensure that the data has been properly programmed into memory cells 106 coupled to select word lines 118. In still another example, page buffer/sense amplifier 304 may also sense the low power signals from bit line 116 that represents a data bit stored in memory cell 106 and amplify the small voltage swing to recognizable logic levels in a read operation.

Column decoder/bit line driver 306 can be configured to be controlled by control logic 312 and select one or more NAND memory strings 108 by applying bit line voltages generated from voltage generator 310. Row decoder/word line driver 308 can be configured to be controlled by control logic 312 and select/deselect blocks 104 of memory cell array 101 and select/deselect word lines 118 of block 104. Row decoder/word line driver 308 can be further configured to drive word lines 118 using word line voltages generated from voltage generator 310. In some implementations, row decoder/word line driver 308 can also select/deselect and drive SSG lines 115 and DSG lines 113 as well. Voltage generator 310 can be configured to be controlled by control logic 312 and generate the word line voltages (e.g., read voltage, program voltage, channel pass voltage, local voltage, verify voltage, etc.), bit line voltages, and source line voltages to be supplied to memory cell array 101.

Control logic 312 can be coupled to each peripheral circuit described above and configured to control the operations of each peripheral circuit. Registers 314 can be coupled to control logic 312 and include status registers, command registers, and address registers for storing status information, command operation codes (OP codes), and command addresses for controlling the operations of each peripheral circuit. Interface 316 can be coupled to control logic 312 and act as a control buffer to buffer and relay control commands received from a memory controller (not shown) and/or a host (not shown) to control logic 312 and status information received from control logic 312 to the memory controller and/or the host. Interface 316 can also be coupled to column decoder/bit line driver 306 via data bus 318 and act as a data input/output (I/O) interface and a data buffer to buffer and relay the data to and from memory cell array 101.

Figure 4A:
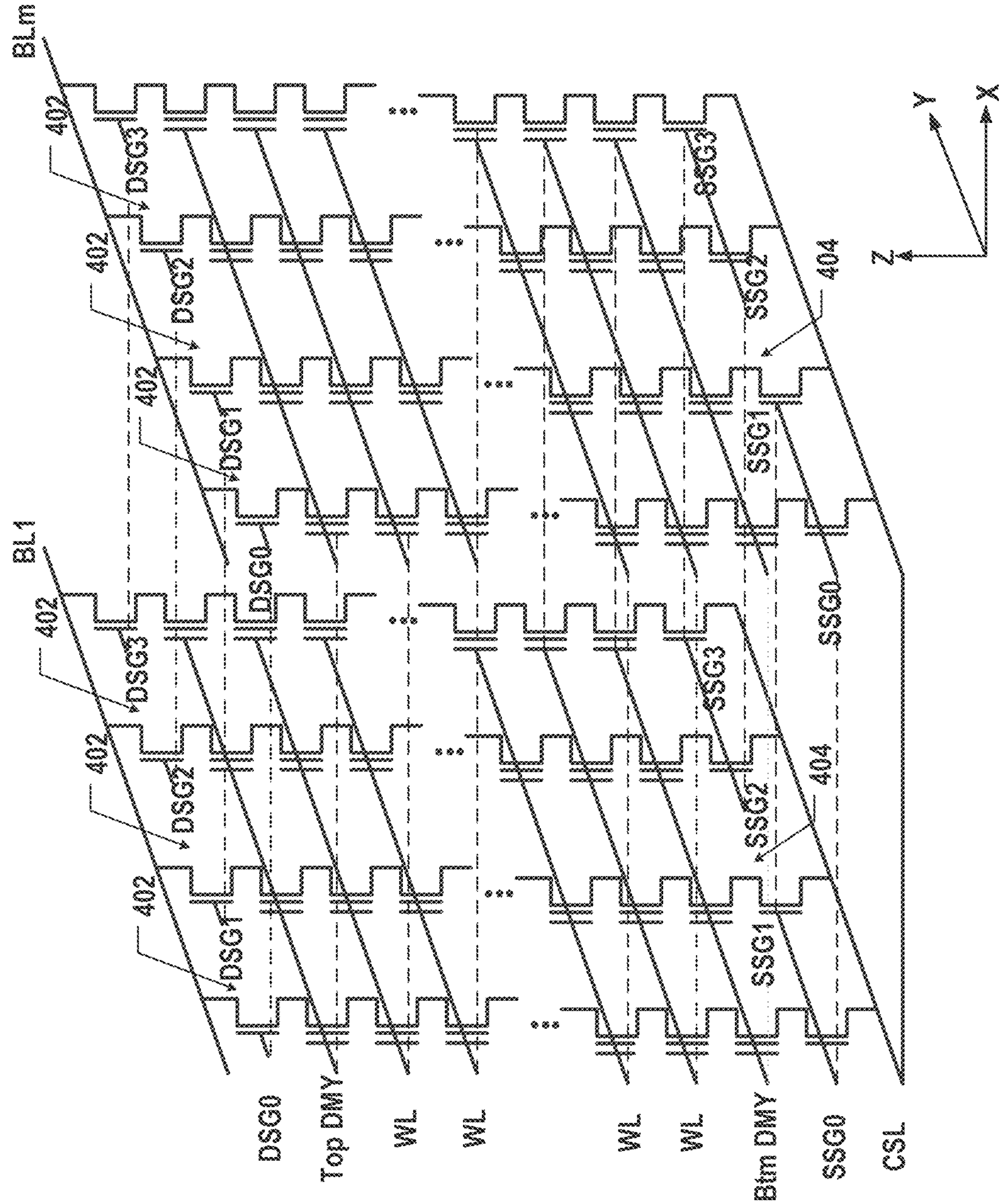
FIG. 4A illustrates a schematic diagram of three-dimensional (3D) NAND memory strings, according to some aspects of the present disclosure.
Figure 4B:
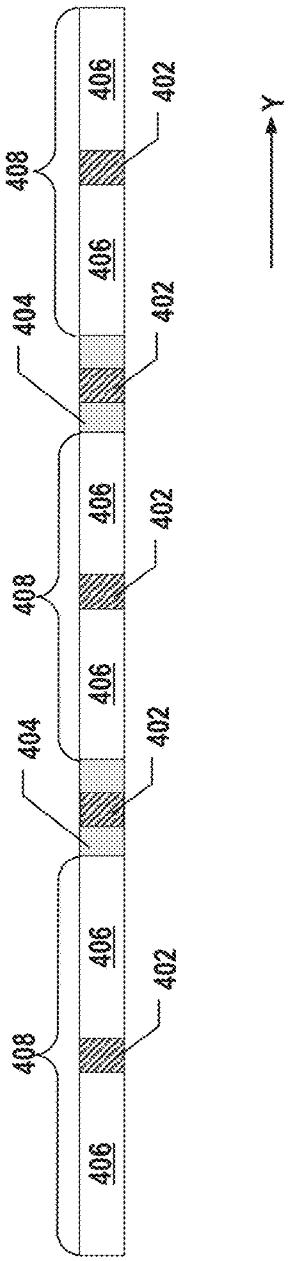
FIGS. 4B and 4C illustrate schematic block diagrams of 3D NAND memory strings, according to some aspects of the present disclosure.
Figure 4C:
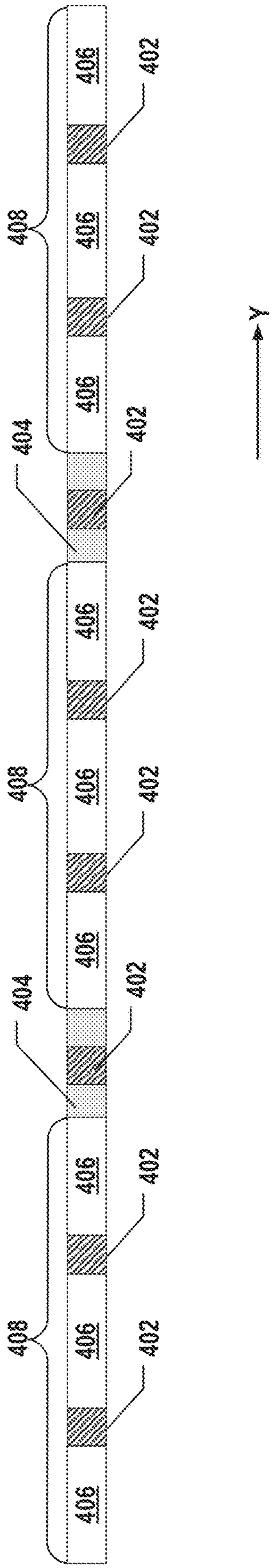

FIGS. 4A-4C illustrate schematic diagrams of 3D NAND memory strings, according to some aspects of the present disclosure. FIG. 4A shows an example of an array of 3D NAND memory strings (e.g., 108 in FIG. 1) in a block (e.g., 104 in FIG. 1). As shown in FIG. 4A, from top to bottom in the z-direction, each 3D NAND memory string may be coupled to a number of lines in different rows, e.g., DSG lines (DSGs, e.g., 113 in FIG. 1), dummy DSG lines (top DMYs), word lines (WLs, e.g., 118 in FIG. 1), dummy SSG lines (bottom DMYs), SSG line (SSG, e.g., 115 in FIG. 1), and common source line (CSL, e.g., 114 in FIG. 1). As shown in FIG. 4A, in both the word line direction (the x-direction) and the bit line direction (the y-direction), the word lines may extend laterally to connect the memory cells of the 3D NAND memory strings. As to the DSG lines and SSG lines, the DSG lines and SSG lines may be continuous in the word line direction (the x-direction) to connect the DSG transistors and SSG transistors of the 3D NAND memory strings at the same position in the y-direction (e.g., DSG0 and DSG0, SSG0 and SSG0), but may be separated by DSG cuts 402 and SSG cuts 404 in the bit line direction (the y-direction) to form electrically-separated sets 406 and fingers 408, respectively, (shown in FIG. 4B), which can be individually controlled in a program operation.

As shown in FIGS. 4B and 4C, an array of 3D NAND memory strings can be divided into multiple sets 406 in the bit line direction (the y-direction) by DSG cuts 402 that electrically separate DSG line(s) and DSG transistors (e.g., each of DSG0, DSG1, DSG2, and DSG3 is separated in FIG. 4A). As a result, each set 406 of 3D NAND memory strings may be individually controlled in a program operation by individually selected and controlling the respective DSG line. As shown in FIGS. 4B and 4C, the array of 3D NAND memory strings can also be divided into multiple fingers 408 in the bit line direction (the y-direction) by SSG cuts 404 that electrically separate SSG line(s) and SSG transistors (e.g., SSG0 and SSG1 are separated from SSG2 and SSG3 in FIG. 4A). As a result, each finger 408 of 3D NAND memory strings may be individually selected and controlled in a program operation by individually controlling the respective SSG line. It is noted that, each finger 408 can include any suitable number of sets 406, such as two sets 406 in one finger 408 as shown in FIG. 4B, or three sets 406 in one finger 408 as shown in FIG. 4C.

Taking FIG. 4A as an illustrative example, the array of 3D NAND memory strings may be divided by 3 DSG cuts 402 into 4 sets 406 each including the 3D NAND memory strings having DSG0, DSG1, DSG2, and DSG3, respectively; the array of 3D NAND memory strings may also be divided by 1 SSG cut 404 into 2 fingers 408, one including the 3D NAND memory strings having SSG0 and SSG1, and the other one including the 3D NAND memory strings having SSG2 and SSG3. Consistent with the scope of the present disclosure, in some implementations, an array of 3D memory strings is divided into sets 406 and fingers 408 by DSG cuts 402 and SSG cuts 404, respectively, in a program operation, and each set 406 is the basic unit for program operation for implementing program operation schemes, such as 3 or 4-bit line (3BL or 4BL) bias program.

It is understood that DSG cuts 402 may be implemented as physical cuts that replace parts of the DSG lines with dielectric layers (e.g., DSG cuts 210 shown in FIG. 2), or may be implemented as electrical cuts that pre-program (a.k.a. trim) different DSG transistors to different threshold voltage levels. Similarly, it is understood that SSG cuts 404 may be implemented as physical cuts that replace parts of the SSG lines with dielectric layers (e.g., SSG cuts 212 shown in FIG. 2), or may be implemented as electrical cuts that pre-program (a.k.a. trim) different SSG transistors to different threshold voltage levels. It is also understood that the interval between adjacent DSG cuts 402 or SSG cuts 404 (i.e., the number of 3D NAND memory strings in each set 406 or each finger 408) may vary in different examples.

To perform a program operation, in addition to page buffer/sense amplifier 304 providing to each select memory cell 106 the corresponding piece of data, row decoder/word line driver 308 can be configured to apply program voltages and verify voltages to a select word line 118 coupled to a select row of memory cells 106 in one or more program/verify cycles in order to raise the threshold voltage of each select memory cell 106 to a desired level (into a desired range of threshold voltages) based on the corresponding piece of data. For example, FIGS. 5A and 5B illustrate a waveform of word line voltages applied to a select word line in a program operation, according to some aspects of the present disclosure.

Figure 5A:
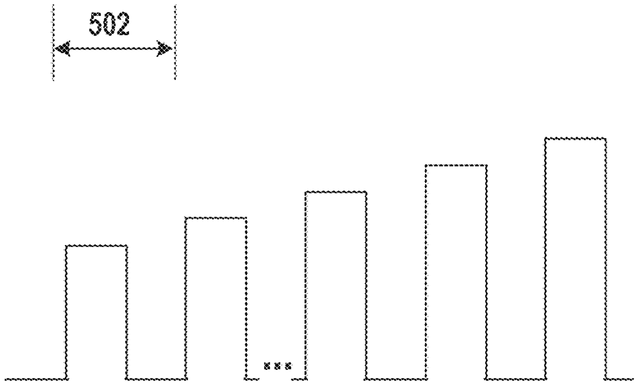
FIGS. 5A and 5B illustrate a waveform of word line voltages applied to a select word line in a program operation, according to some aspects of the present disclosure.
Figure 5B:
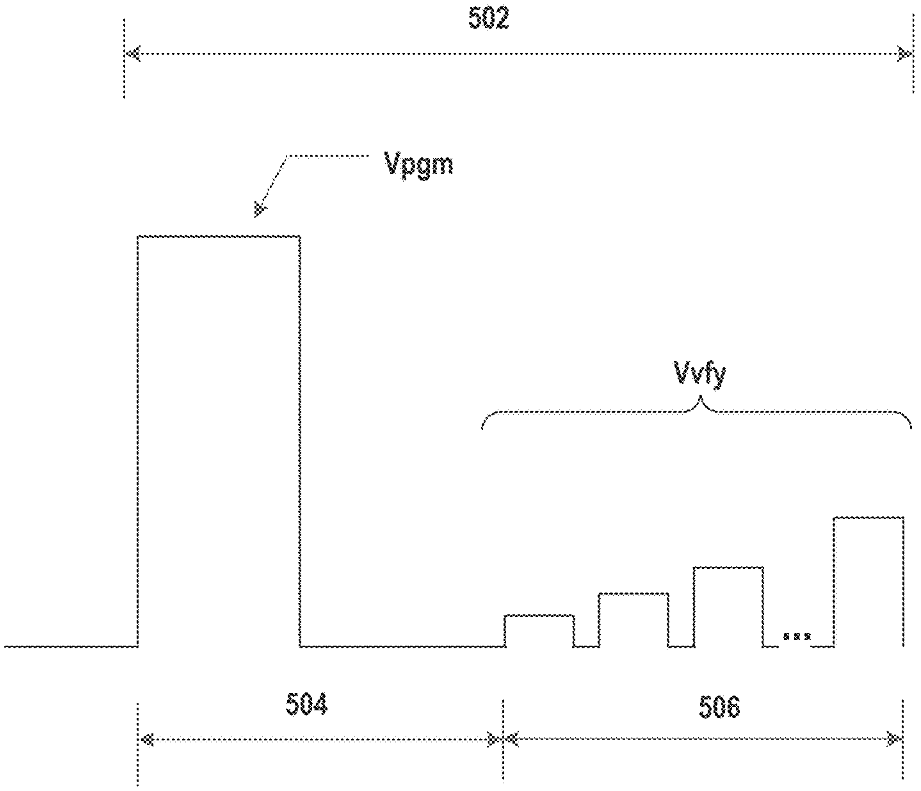

As shown in FIGS. 5A and 5B, the program operation includes one or more loops 502, each of which includes a program cycle 504 and a verify cycle 506, according to some implementations. As shown in FIG. 5B, in each loop 502, row decoder/word line driver 308 can be configured to apply a program voltage ($V_{pgm}$) on select word line 118 to select row of memory cells 106 in program cycle 504 and sequentially apply one or more verify voltages (Vvfy) with incremental changes of voltage levels to verify select row of memory cells 106 in verify cycle 506. That is, in each loop 502, peripheral circuit 102 can perform verification of select row of memory cells 106 at one or more levels in verify cycle 506 after applying a program voltage in program cycle 504. The number of verify voltages applied in verify cycle 506 depends on the level being programmed by the specific loop 502, according to some implementations. As a result, at the end of the program operation, for example, select memory cell 106 may be programmed into one of the $2^N$ levels based on the corresponding N bits of data to be stored in select memory cell 106, where N is a positive integer.

In some implementations, the program operation is an incremental step pulse program (ISPP), which gradually increases the program voltage on a step-voltage basis in different loops 502. The magnitude of this "step" (e.g., the increase in magnitude of the program voltage in each loop 502 relative to the program voltage in the immediately previous loop 502) is known as the "pulse step height." Consistent with the scope of the present disclosure, in some implementations, the program operation includes at least a first loop 502 and a second loop 502 after the first loop 502, and the first loop 502 and the second loop 502 are the starting loop and the ending loop of ISPP, respectively.

Figure 6A:
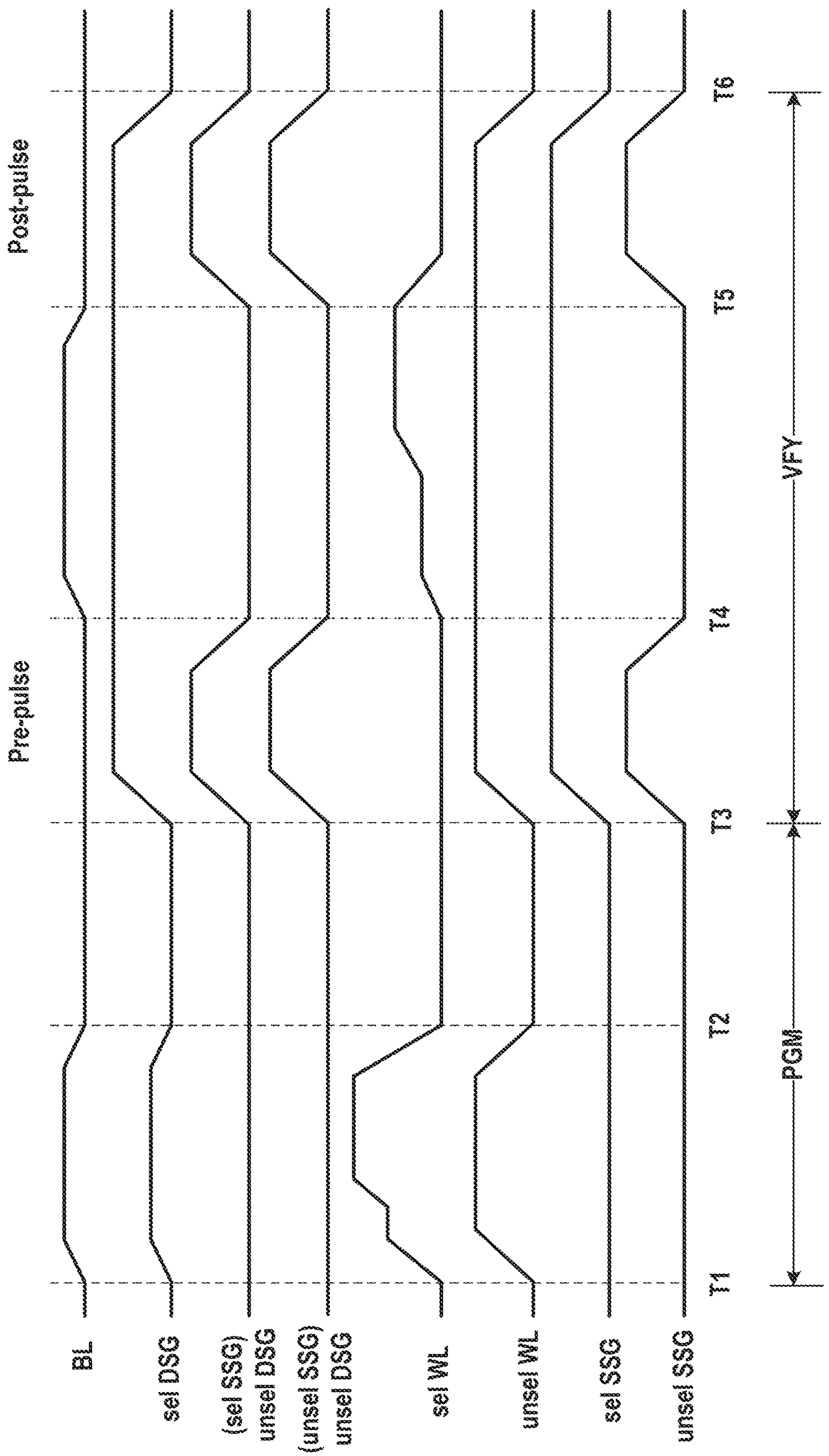
FIG. 6A illustrates a timing diagram of a program operation, according to some aspects of the present disclosure.

FIG. 6A illustrates timing diagrams of a program operation. The program operation can be ISPP including a plurality of loops each including a program cycle (PGM) and a verify cycle (VFY), as described above in FIGS. 5A and 5B. Each verify cycle may include a verify period (phase) in which one or more verify voltage pulses are applied to select word line (sel WL) to verify select memory cells coupled to the select word line at one or more levels. As shown in FIG. 6, each verify cycle includes a pre-pulse stage (phase) before the verify period in which the NAND memory strings get ready for verification, and/or further includes a post-pulse stage (phase) (a.k.a., recovery period) immediately after the verify period in which the NAND memory strings become recovered from verification and get ready for another operation (e.g., read operation) after the ending loop or get ready for programming in the next loop after any non-ending loops.

As shown in FIG. 6A, for each select NAND memory string, a select voltage (e.g., a positive voltage) may be applied to each select DSG line (sel DSG) and select SSG line (sel SSG) to turn on each select DSG transistor and select SSG transistor during the verify period (e.g., from T4 to T5) of each loop in order to verify the select memory cells of each select NAND memory string in the verify period. In contrast, for each unselect NAND memory string, a deselect voltage (e.g., a ground voltage) may be applied to each unselect DSG line (unsel DSG) and unselect SSG line (unsel SSG) to turn off each unselect DSG transistor and unselect SSG transistor in the verify period (e.g., from T4 to T5) of each loop to inhibit the verification of the unselect memory cells of each unselect NAND memory string in the verify period. Further, a pass voltage (e.g., a positive voltage) may be applied to each unselect word line (unsel WL) at T3.

On the other hand, the channel potential of an unselect NAND memory string may be up-coupled to a positive potential in the pre-pulse stage, thereby causing HCI in the channel between the DSG transistor and SSG transistor. Thus, as shown in FIG. 6A, in the pre-pulse stage of each loop, a select voltage may be applied to each unselect DSG line and unselect SSG line to turn on each unselect DSG transistor and unselect SSG transistor at T3 in order to decrease the channel potential and eliminate HCI before the verify period, also known as "pre-pulse channel cleaning." Similarly, the channel potential of an unselect NAND memory string may be down-coupled to a negative potential in the post-pulse stage, causing HCI as well in the channel between the DSG transistor and SSG transistor. Thus, as shown in FIG. 6A, in the post-pulse stage of each loop, a select voltage may be applied to each unselect DSG line and unselect SSG line to turn on each unselect DSG transistor and unselect SSG transistor again at T5 in order to increase the channel potential and eliminate HCI before the next operation, also known as "post-pulse channel cleaning." The pre-pulse channel cleaning and post-pulse channel cleaning performed in each loop, however, prolong the duration of each verify cycle, thereby becoming the bottleneck of saving program time.

Figure 7A:
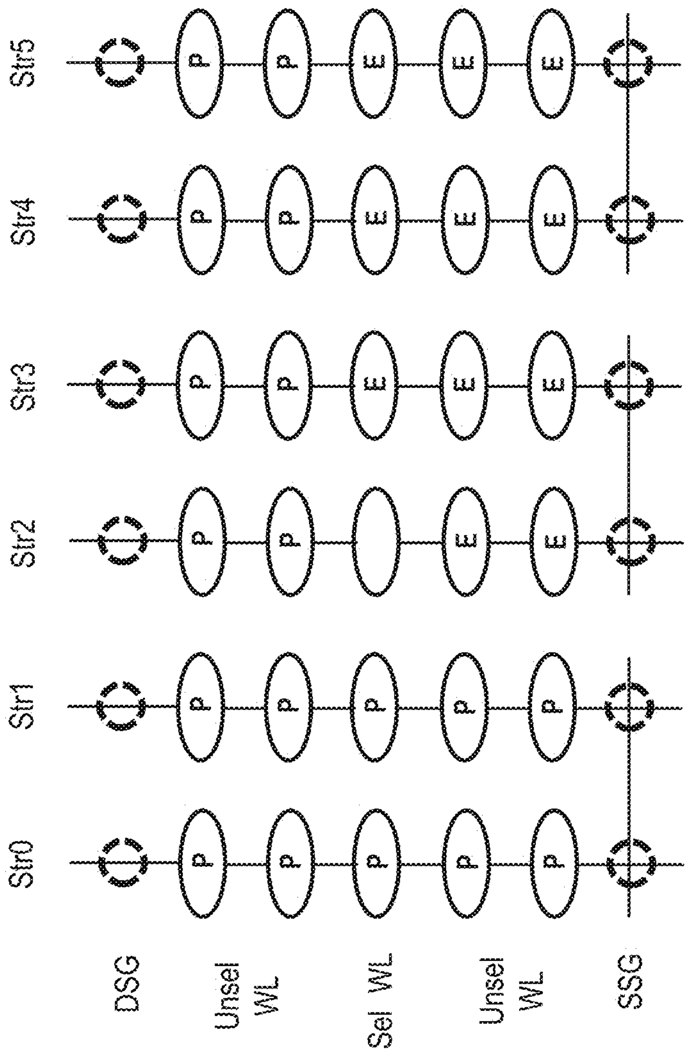
FIG. 7A illustrates a schematic diagram of various voltages applied to a memory string in a program operation, according to some aspects of the present disclosure.

In some implementations, by using the SSG cuts (e.g., 212 in FIG. 2, 404 in FIGS. 4A-4C) and the DSG cuts (e.g., 210 in FIG. 2, 402 in FIGS. 4A-4C), different strings may have different levels of HCI effect. FIG. 7A illustrates a schematic diagram of states of memory cells in memory strings in a program operation, according to some aspects of the present disclosure. As shown in one illustrative example in FIG. 7A, there are six strings Str0, Str1, Str2, Str3, Str 4, and Str5 connected to a same bit line. The DSG transistors of the six strings Str0, Str1, Str2, Str3, Str 4, and Str5 are separated from each other due to the DSG cuts between adjacent DSG transistors. Further, the six strings belong to three fingers due to the SSG cut between SSG transistors of Str1 and Str2 and the SSG cut between SSG transistors of Str3 and Str4. Assume in each finger, the memory cells in the even number of strings are firstly programmed, and the memory cells in the odd number of strings are programmed after programming the memory cells in the even number of strings. In such case, when a memory cell in Str2 is firstly programmed, the unselected Str3 (e.g., in the erase state) in the same finger can have a low level of HCI effect during verifying the memory cell in Str2. However, when a memory cell in Str3 in the same finger is programmed after programming the memory cell in Str2, the unselected Str2 (e.g., in the program state) in the same finger can have a high level of HCI effect during verifying the memory cell in Str3. Accordingly, the present disclosure provides separated channel cleaning schemes for different memory strings which would have different channel potentials beginning from the pre-pulse stage during the verify operation.

Figure 7D:
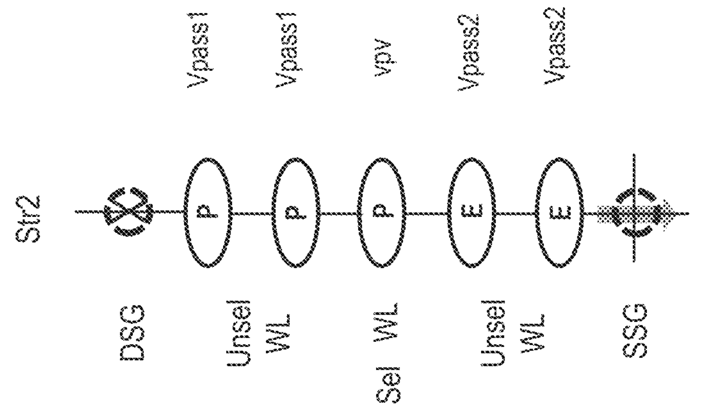
FIG. 7D illustrates a schematic diagram of various voltages applied to a memory string in a program operation, according to some aspects of the present disclosure.
Figure 7C:
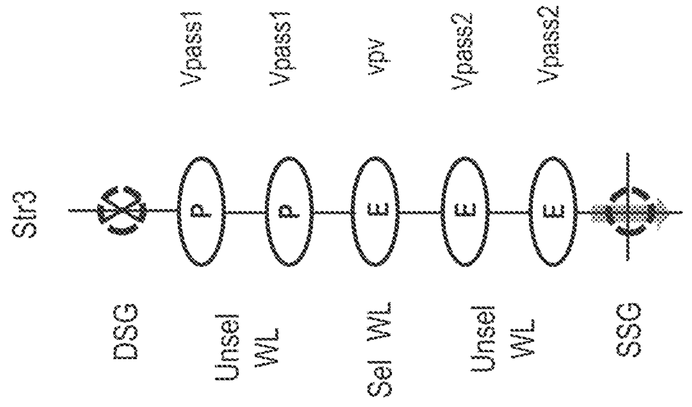
FIG. 7C illustrates a schematic diagram of various voltages applied to a memory string in a program operation, according to some aspects of the present disclosure.
Figure 7B:
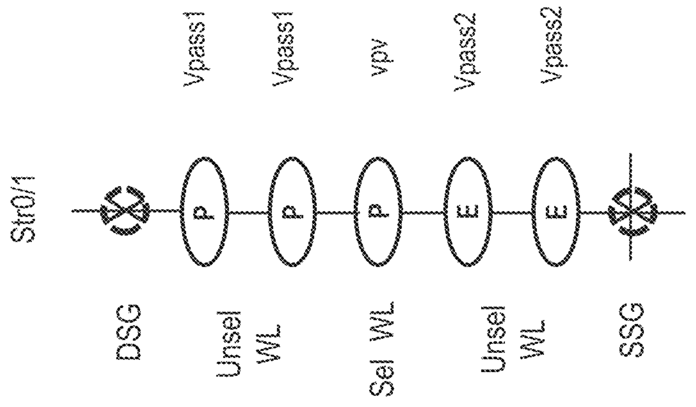
FIG. 7B illustrates a schematic diagram of various voltages applied to a memory string in a program operation, according to some aspects of the present disclosure.

Accordingly, in some implementations, the pre-pulse channel cleaning and/or the post-pulse channel cleaning may be skipped without significantly impacting channel potential for certain unselect strings, in particular when SSG cuts are implemented to separate 3D NAND memory strings into fingers. FIGS. 7B-7D each illustrates a schematic diagram of various voltages applied to a memory string in a program operation, according to some aspects of the present disclosure.

In a first scenario, when verifying the memory cell of Str2 (first programmed in the finger) without applying a pre-pulse channel cleaning operation, the DSG transistors and SSG transistors of Str0 and Str1 in different fingers with respect to Str2 are closed as shown in FIG. 7B. That it, the memory cells coupled with the select word line in Str0 and Str1 have been programmed and may be in the program state, while the memory cells coupled with the select word line in Str 4 and Str 5 have not been programmed and are in the erase state, and the channels of Str0, Str1, Str 4, and Str 5 are floating. Therefore, the HCI effect in Str0, Str1, Str 4 and Str 5 is in a low level due to the boosted-up channel potential. Further, as shown in FIG. 7C, when verifying the memory cell of Str2 without applying a pre-pulse channel cleaning operation, Str3 in a same finger with Str2 has its DSG transistor closed and SSG transistor open. Since the memory cell coupled with the select word line in Str3 is in the erase state, the channel potential of Str3 is flat at the high voltage level, thereby maintaining a low level HCI effect in Str3.

In a second scenario, when verifying the memory cell of Str3 (later programmed in the finger) without applying a pre-pulse channel cleaning operation, the DSG transistors and SSG transistors of Str0 and Str1 in different fingers with respect to Str2 are closed as shown in FIG. 7B. That it, the memory cells coupled with the select word line in Str0 and Str1 have been programmed and may be in the program state, while the memory cells coupled with the select word line in Str 4, and Str 5 are in the erase state, and the channels of Str0, Str1, Str 4, and Str 5 are floating. Therefore, the HCI effect in Str0, Str1, Str 4, and Str 5 is still at a low level due to the boosted-up channel potential. Further, as shown in FIG. 7D, when verifying the memory cell of Str3 without applying a pre-pulse channel cleaning operation, Str2 in a same finger with Str2 has its DSG transistor closed and SSG transistor open. However, since the memory cell coupled with the select word line in Str2 is in the program state, the channel potential of the upper portion of Str2 above the memory cell in the program state is further boosted up to a higher voltage level, thereby causing a high level HCI effect in Str2.

In some implementations, each finger includes two strings, i.e., an even memory string and an odd memory string, when a first memory cell of the even memory string is programmed first, the pre-pulse stage can be omitted during the verify cycle of the first memory cell, while a second memory cell of the odd memory string is programmed after the first memory cell, the pre-pulse stage is not omitted during the verify cycle of the second memory cell. In some other implementations, each finger includes three or more strings, i.e., $1^{st}$ string, $2^{nd}$ string, $3^{rd}$ string, etc., when a first memory cell of $1^{st}$ string in the finger is programmed first, the pre-pulse stage can be omitted during the verify cycle of the first memory cell, while a second memory cell of another memory string (i.e., $2^{nd}$ string, $3^{rd}$ string, etc.) is programmed after the first memory cell, the pre-pulse stage is not omitted during the verify cycle of the second memory cell. Therefore, according to some aspects of the present disclosure, the channel cleaning in the pre-pulse stage (and/or post-pulse stage) of the verify cycle(s) can be skipped. For example, in some implementations, when firstly programming a memory cell of a first select string in a finger, the memory cell can be verified without applying a pre-pulse stage. In some other implementations, when firstly programming a memory cell of a memory string in a finger, the memory cell can be verified without applying both the pre-pulse stage and the post-pulse stage.

Figure 6B:
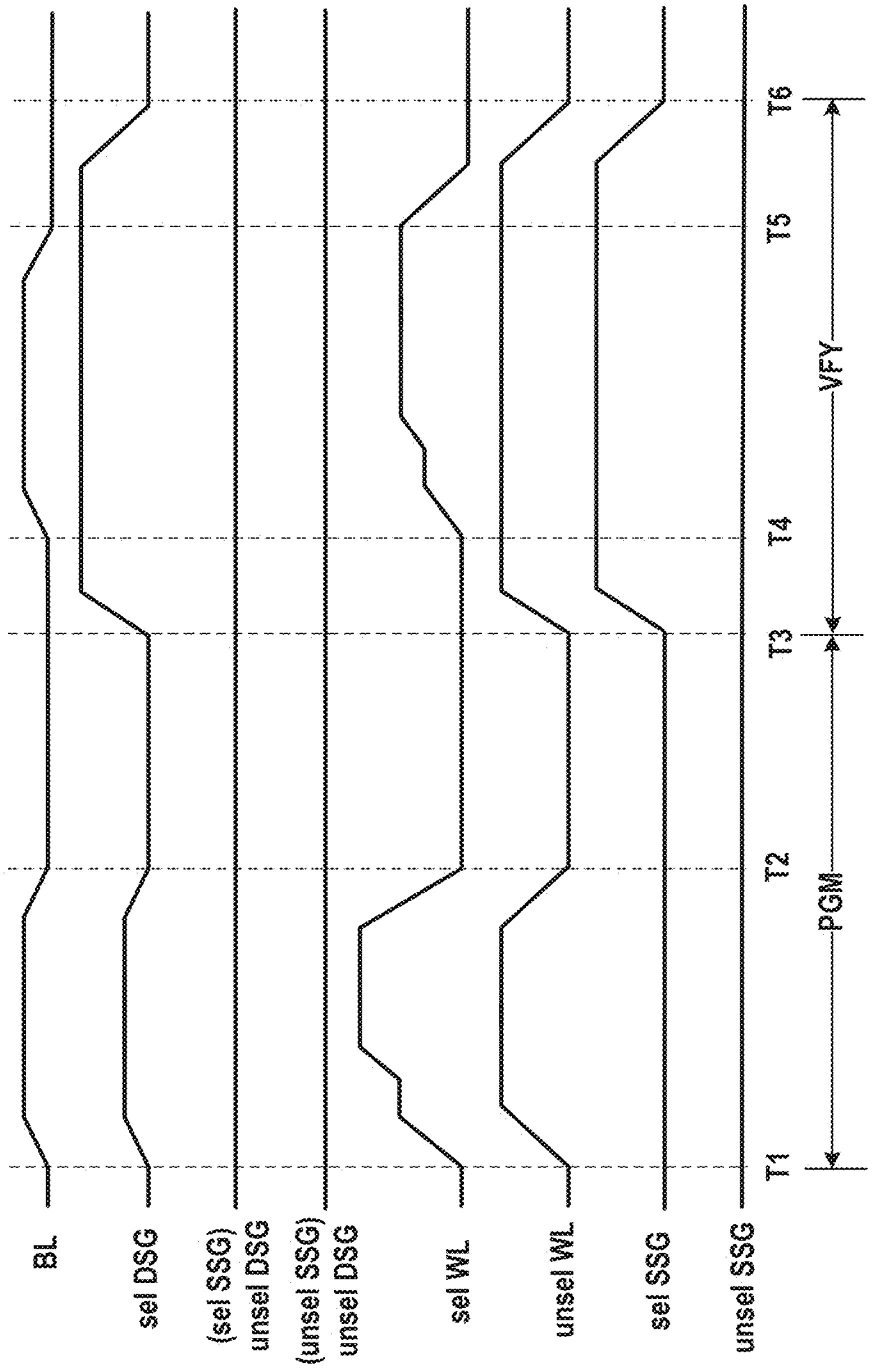
FIG. 6B illustrates a timing diagram of a program operation, according to some aspects of the present disclosure.

As shown in FIG. 6B, in the verify cycle(s), both of the pre-pulse stage and the post-pulse stage are omitted. Specifically, word line driver 308 of peripheral circuit 102 can be configured to apply a select voltage (e.g., a positive voltage) to the select SSG line (sel SSG), such that the select SSG transistor in the select NAND memory string coupled with the select SSG line can be turned on at T3. Similarly, word line driver 308 of peripheral circuit 102 can be configured to apply a select voltage (e.g., a positive voltage) to the select DSG line (sel DSG), such that the select DSG transistor in the select NAND memory string coupled with the select DSG line can be turned at T3. Further, word line driver 308 of peripheral circuit 102 can be configured to apply a pass voltage (e.g., a positive voltage) to the unselect word lines (sel WL) at T3.

It is noted that, the select voltage applied to the select DSG line can be the same with or be different from the select voltage applied to the select SSG line, and the pass voltage applied to the unselect word lines can be the same with or be different from the select voltages applied to the select SSG line and/or the select DSG line. It is further noted that, although FIG. 6B shows that it is a same start time point T3 and a same end time point T6 of providing the select voltages to the select SSG line and the select DSG line, as well as providing the pass voltage to the unselect word lines. However, in the actual practice, the start time points and/or the end time points of providing the select voltages to the select SSG line and the select DSG line, as well as proving the pass voltage to the unselect word lines may be different.

In addition, the time period of the unselect word lines reaching the pass voltage from T3 in the verify cycle as shown in FIG. 6B is less than the time period of the unselect word lines reaching the pass voltage from T3 in the pre-pulse stage as shown in FIG. 6A, and the time period of the select word line reaching the verify voltages from T4 in the verify cycle as shown in FIG. 6B is less than the time period of the select word line reaching the verify voltages from T4 in the verify cycle as shown in FIG. 6A. It is note that, although FIG. 6B shows that the start time point T4 of applying verify voltages to select word line is after time point T3, in some other implementations not shown in the figures, T3 and T4 can be at a same time point.

In some implementations, word line driver 308 of peripheral circuit 102 can be configured to apply a deselect voltage (e.g., the ground voltage) to the unselect SSG line (unsel SSG) and the unselect SSG transistor in the unselect NAND memory string to turn off the unselect SSG transistor during the verify cycle. Similarly, word line driver 308 of peripheral circuit 102 can be configured to apply a deselect voltage (e.g., the ground voltage) to the unselect DSG line (unsel DSG) and the unselect DSG transistor in the unselect NAND memory string to turn off the unselect DSG transistor during the verify cycle. In other words, both the pre-pulse channel cleaning and post-pulse channel cleaning can be skipped for unselect NAND memory strings (e.g., having unselect SSG transistor and unselect DSG transistor), thereby saving the program time.

Figure 6C:
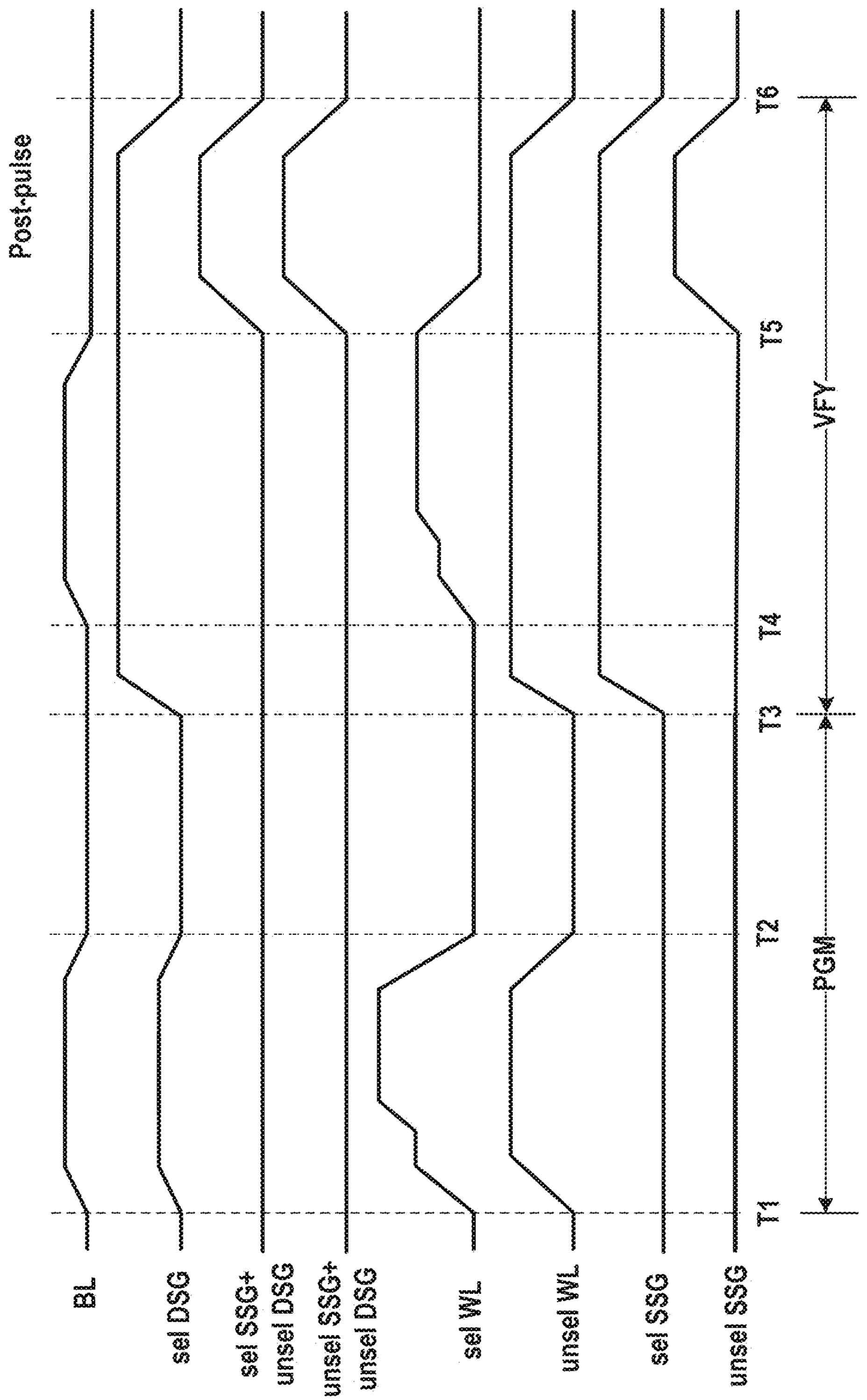
FIG. 6C illustrates a timing diagram of a program operation, according to some aspects of the present disclosure.

As shown in FIG. 6C, in the verify cycle(s), only the pre-pulse stage is omitted while the post-pulse stage is maintained. Specifically, word line driver 308 of peripheral circuit 102 can be configured to apply a select voltage (e.g., a positive voltage) to the select SSG line (sel SSG) and the select SSG transistor in the select NAND memory string to turn on the select SSG transistor at T3. Similarly, word line driver 308 of peripheral circuit 102 can be configured to apply a select voltage (e.g., a positive voltage) to the select DSG line (sel DSG) and the select DSG transistor in the select NAND memory string to turn on the select DSG transistor at T3. Further, word line driver 308 of peripheral circuit 102 can be configured to apply a pass voltage (e.g., a positive voltage) to the unselect word lines (sel WL) at T3. It is noted that, the time period of the unselect word lines reaching the pass voltage from T3 in the verify cycle as shown in FIG. 6C is less than the time period of the unselect word lines reaching the pass voltage from T3 in the pre-pulse stage as shown in FIG. 6A.

In some implementations, word line driver 308 of peripheral circuit 102 can be configured to apply a deselect voltage (e.g., the ground voltage) to the unselect SSG line (unsel SSG) and the unselect SSG transistor in the unselect NAND memory string to turn off the unselect SSG transistor from T3 to T5 in the verify cycle, and to apply a select voltage (e.g., a positive voltage) to each unsel SSG to turn on each unselect SSG transistor in the post-pulse stage at T5. Similarly, word line driver 308 of peripheral circuit 102 can be configured to apply a deselect voltage (e.g., the ground voltage) to the unselect DSG line (unsel DSG) and the unselect DSG transistor in the unselect NAND memory string to turn off the unselect DSG transistor from T3 to T5 in the verify cycle, and to apply a select voltage (e.g., a positive voltage) to each unsel DSG to turn on each unselect DSG transistor in the post-pulse stage at T5. In other words, only the pre-pulse channel cleaning is skipped while the post-pulse channel cleaning is maintained for unselect NAND memory strings (e.g., having unselect SSG transistor and unselect DSG transistor), thereby saving the program time.

Figure 8:
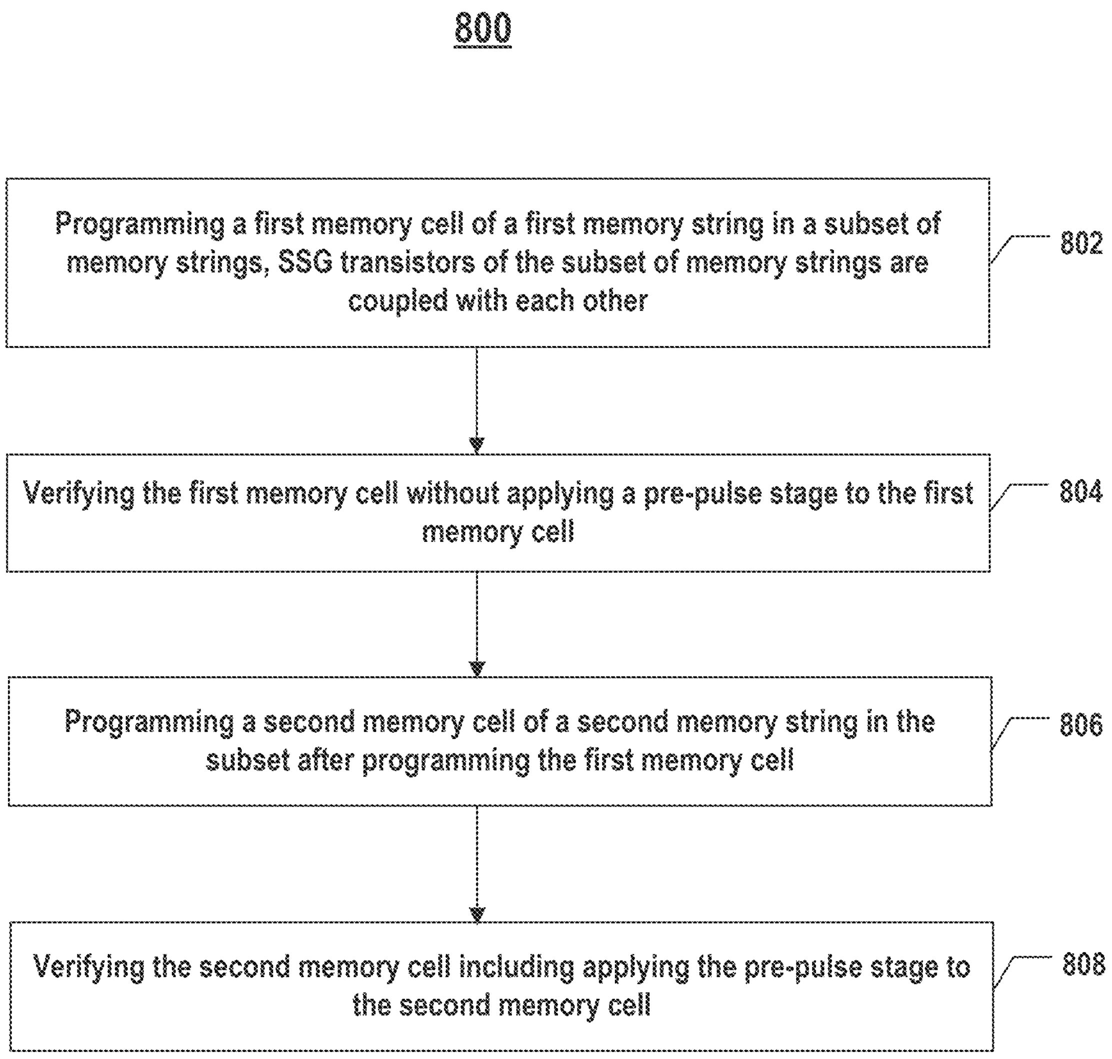
FIG. 8 illustrates a flowchart of a method for operating a memory device, according to some aspects of the present disclosure.

FIG. 8 illustrates a flowchart of a method 800 for operating a memory device, according to some aspects of the present disclosure. The memory device may be any suitable memory device disclosed herein, such as memory device 100. The memory device can comprise memory strings each comprising a drain select gate (DSG) transistor, memory cells, and a source select gate (SSG) transistor. Method 800 may be implemented by peripheral circuit 102, such as row decoder/word line driver 308, page buffer/sense amplifier 304, and control logic 312. It is understood that the operations shown in method 800 may not be exhaustive and that other operations can be performed as well before, after, or between any of the illustrated operations. Further, some of the operations may be performed simultaneously, or in a different order than shown in FIG. 8.

Referring to FIG. 8, method 800 starts at operation 802, in which a first memory cell of a first memory string in a subset of memory strings is firstly programmed. The SSG transistors of the subset of memory strings are coupled with each other, and the voltage applied to the SSG transistors of the subset of memory strings can be the same. For example, as shown in FIG. 7A, the first memory string can be Str2, the subset of memory strings can include Str2 and Str3 in a same finger, and the first memory cell is the memory cell in Str2 coupled with the select word line. The programming process can refer to the descriptions above in connection with FIGS. 5A-5B and 6A-6C.

Method 800 proceeds to operation 804, as illustrated in FIG. 8, in which the first memory cell can be verified without applying a pre-pulse stage to the first memory cell. For example, as shown in FIGS. 6B and 6C, the pre-pulse stage can be omitted in the verifying process. Specifically, verifying the first memory cell can comprise turning on the SSG transistors of the subset of memory strings and the DSG transistor of the first memory string, keeping the SSG transistors of the memory strings other than the subset of memory strings off during verifying the first memory cell, and keeping the DSG transistors of the memory strings other than the first memory string off during verifying the first memory cell. In some implementations, verifying the first memory cell can further comprise applying a pass voltage to unselect word lines during verifying the first memory cell, and applying verify voltages to a select word line during verifying the first memory cell after the unselect word lines reaching the pass voltage.

Method 800 proceeds to operation 806, as illustrated in FIG. 8, in which a second memory cell of a second memory string in the subset can be programmed after programming the first memory cell. For example, as shown in FIG. 7A, the second memory string can be Str3, the subset of memory strings can include Str2 and Str3 in a same finger, and the second memory cell is the memory cell in Str3 coupled with the select word line. The programming process can refer to the descriptions above in connection with FIGS. 5A-5B and 6A-6C.

Method 800 proceeds to operation 808, as illustrated in FIG. 8, in which the second memory cell can be verified including applying the pre-pulse stage to the second memory cell. For example, as shown in FIG. 6A, the pre-pulse stage and the post-pulse stage are applied in the verifying process. Specifically, verifying the second memory cell can include applying a pass voltage to unselect word lines during verifying the first memory cell, and applying verify voltages to a select word line during verifying the first memory cell after the unselect word lines reach the pass voltage. In some implementations, verifying the second memory cell can further comprise turning on the SSG transistors of the subset of memory strings and the DSG transistor of the second memory string, turning on the SSG transistors of the memory strings other than the subset of memory strings in the pre-pulse stage of verifying the second memory cell, turning on the DSG transistors of the memory strings other than the second memory string in the pre-pulse stage of verifying the second memory cell.

In some implementations, verifying the second memory cell can further comprise applying the pass voltage to unselect word lines in the pre-pulse stage verifying the second memory cell, and after the pre-pulse stage, applying verify voltages to the select word line during verifying the second memory cell. In some implementations, a first time period of the unselect word lines reaching the pass voltage during verifying the first memory cell is less than a second time period of the unselect word lines reaching the pass voltage during verifying the second memory cell. In some implementation, a first time interval between turning on the DSG transistor of the first memory string and applying a first verify voltage to the select word line is less than a second time interval between turning on the DSG transistor of the second memory string and applying the first verify voltage to the select word line.

Figure 9:
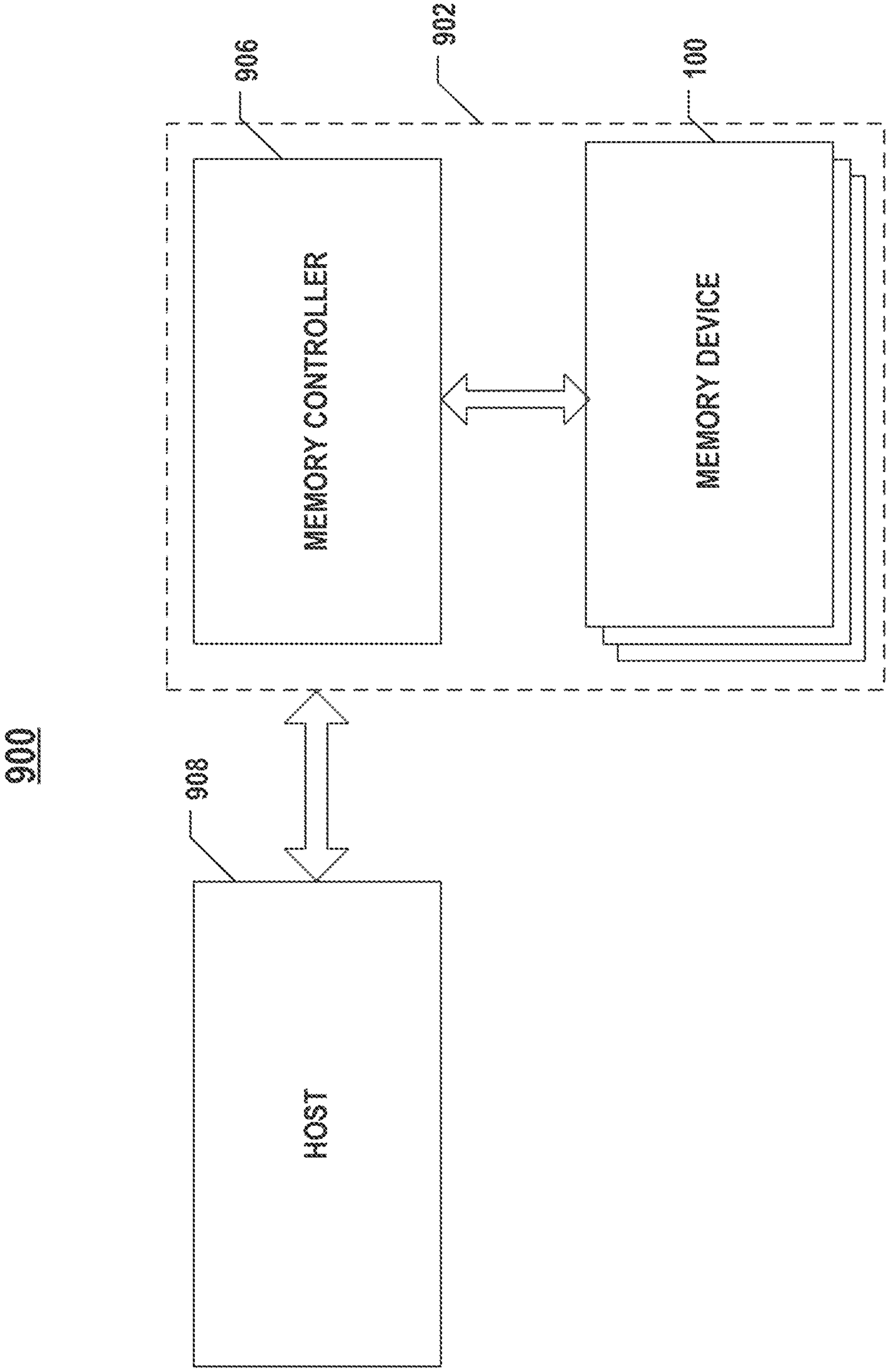
FIG. 9 illustrates a block diagram of a system having a memory device, according to some aspects of the present disclosure.

FIG. 9 illustrates a block diagram of a system 900 having a memory device, according to some aspects of the present disclosure. System 900 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 9, system 900 can include a host 908 and a memory system 902 having one or more memory devices 100 (shown in FIG. 1) and a memory controller 906. Host 908 can be a processor of an electronic device, such as a central processing unit (CPU), or a system-on-chip (SoC), such as an application processor (AP). Host 908 can be configured to send or receive data to or from memory devices 100.

Memory device 100 can be any memory device disclosed in the present disclosure. Memory controller 906 is coupled to memory device 100 and host 908 and is configured to control memory device 100, according to some implementations. Memory controller 906 can manage the data stored in memory device 100 and communicate with host 908. In some implementations, memory controller 906 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 906 is designed for operating in a high duty-cycle environment SSDs or embedded multi-media-cards (eMMCs) used as data storage for mobile devices, such as smartphones, tablets, laptop computers, etc., and enterprise storage arrays. Memory controller 906 can be configured to control operations of memory device 100, such as read, erase, and program operations. Memory controller 906 can also be configured to manage various functions with respect to the data stored or to be stored in memory device 100 including, but not limited to bad-block management, garbage collection, logical-to-physical address conversion, wear leveling, etc. In some implementations, memory controller 906 is further configured to process error correction codes (ECCs) with respect to the data read from or written to memory device 100. Any other suitable functions may be performed by memory controller 906 as well, for example, formatting memory device 100. Memory controller 906 can communicate with an external device (e.g., host 908) according to a particular communication protocol. For example, memory controller 906 may communicate with the external device through at least one of various interface protocols, such as a USB protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 10A:
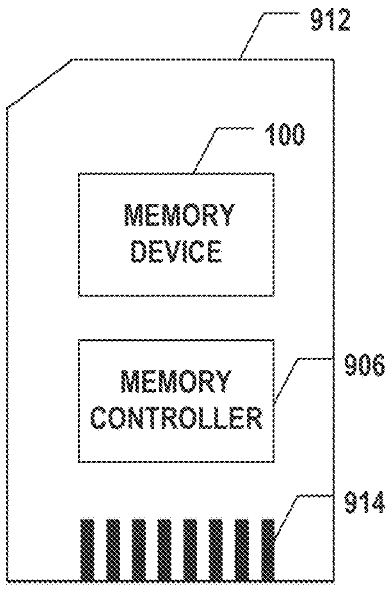
FIG. 10A illustrates a diagram of a memory card having a memory device, according to some aspects of the present disclosure.
Figure 10B:
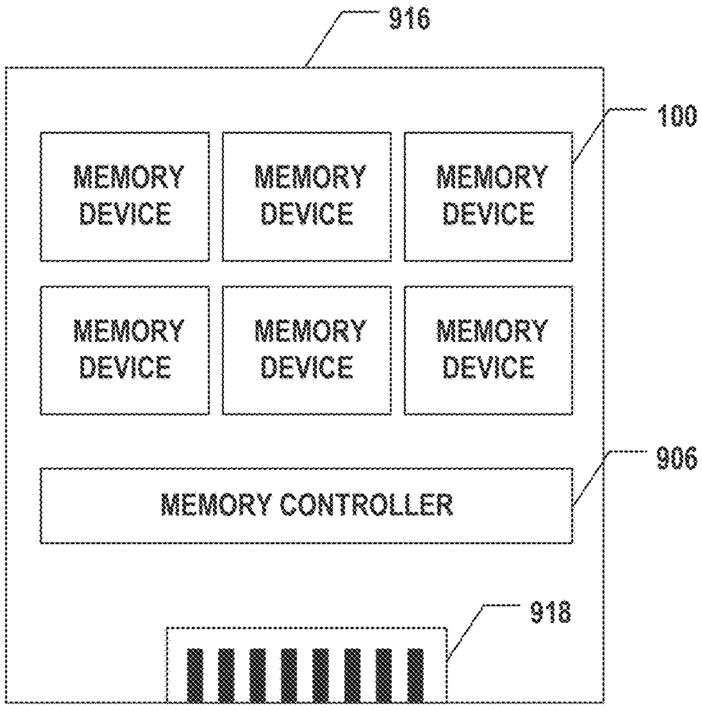
FIG. 10B illustrates a diagram of a solid-state drive (SSD) having a memory device, according to some aspects of the present disclosure.

Memory controller 906 and one or more memory devices 100 can be integrated into various types of storage devices, for example, being included in the same package, such as a universal Flash storage (UFS) package or an eMMC package. That is, memory system 902 can be implemented and packaged into different types of end electronic products. In one example as shown in FIG. 10A, memory controller 906 and a single memory device 100 may be integrated into a memory card 912. Memory card 912 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 912 can further include a memory card connector 914 coupling memory card 912 with a host (e.g., host 908 in FIG. 10). In another example as shown in FIG. 10B, memory controller 906 and multiple memory devices 100 may be integrated into an SSD 916. SSD 916 can further include an SSD connector 918 coupling SSD 916 with a host (e.g., host 908 in FIG. 9). In some implementations, the storage capacity and/or the operation speed of SSD 916 is greater than those of memory card 912.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features as described in the present disclosures can be combined, adjusted, modified, and rearranged with one another and in ways that are consistent with the scope of the present disclosure.

What is claimed is:

1. A method for operating a memory device, the memory device comprising memory strings each comprising a drain select gate (DSG) transistor, memory cells, and a source select gate (SSG) transistor, the method comprising:

programming a first memory cell of a first memory string in a subset of memory strings, wherein the SSG transistors of the subset of memory strings are coupled with each other;

verifying the first memory cell without applying a pre-pulse stage to the first memory cell, comprising turning on the DSG transistor of the first memory string;

programming a second memory cell of a second memory string in the subset after programming the first memory cell; and verifying the second memory cell including applying the pre-pulse stage to the second memory cell, comprising turning on the DSG transistor of the second memory string;

wherein a first time interval between turning on the DSG transistor of the first memory string and applying a first verify voltage to a select word line is less than a second time interval between turning on the DSG transistor of the second memory string and applying the first verify voltage to the select word line.

2. The method of claim 1, further comprising:

programming a third memory cell of a third memory string in the subset after programming the first memory string; and verifying the third memory cell including applying the pre-pulse stage to the third memory cell.

3. The method of claim 1, wherein verifying the first memory cell comprises:

turning on the SSG transistors of the subset of memory strings;

keeping the SSG transistors of the memory strings other than the subset of memory strings off during verifying the first memory cell;

keeping the DSG transistors of the memory strings other than the first memory string off during verifying the first memory cell;

applying a pass voltage to unselect word lines during verifying the first memory cell; and after the unselect word lines reaching the pass voltage, applying verify voltages to the select word line during verifying the first memory cell.

4. The method of claim 3, wherein verifying the second memory cell comprises:

turning on the SSG transistors of the subset of memory strings;

turning on the SSG transistors of the memory strings other than the subset of memory strings in the pre-pulse stage of verifying the second memory cell; and turning on the DSG transistors of the memory strings other than the second memory string in the pre-pulse stage of verifying the second memory cell;

applying the pass voltage to unselect word lines in the pre-pulse stage verifying the second memory cell; and after the pre-pulse stage, applying the verify voltages to the select word line during verifying the second memory cell.

5. The method of claim 4, wherein a first time period of the unselect word lines reaching the pass voltage during verifying the first memory cell is less than a second time period of the unselect word lines reaching the pass voltage during verifying the second memory cell.

6. The method of claim 1, further comprising:

providing a same voltage to the SSG transistors of the subset of memory strings that are coupled with each other.

7. The method of claim 1, wherein the first memory cell and the second memory cell are coupled with a same word line.

8. A method for operating a memory device, comprising:

applying a first voltage to a first DSG transistor in a first memory string during a first verifying operation of a first memory cell in the first memory string;

applying a second voltage lower than the first voltage to a second DSG transistor in a second memory string before applying a verify voltage to a word line coupled with the first memory cell during the first verifying operation;

applying the first voltage to the second DSG transistor in the second memory string during a pre-pulse stage of a second verifying operation of a second memory cell in the second memory string and coupled with the word line; and applying a third voltage higher than the second voltage to the first DSG transistor in the first memory string during the pre-pulse stage, wherein a first SSG transistor of the first memory string and a second SSG transistor of the second memory string are coupled with each other, the first verifying operation is before the second verifying operation, wherein a first time interval between applying the first voltage to the first DSG transistor of the first memory string and applying the verify voltage to the word line is less than a second time interval between applying the first voltage to the second DSG transistor of the second memory string and applying the verify voltage to the word line.

9. The method of claim 8, wherein:

the second voltage makes the second DSG transistor in an off state; and the third voltage makes the first DSG transistor in an open state.

10. A memory device, comprising:

memory strings each comprising a drain select gate (DSG) transistor, memory cells, and a source select gate (SSG) transistor; and a peripheral circuit coupled to the memory strings and configured to:

program a first memory cell of a first memory string in a subset of the memory strings, wherein the SSG transistors of the subset of memory strings are coupled with each other, turn on the DSG transistor of the first memory string to verify the first memory cell without applying a pre-pulse stage to the first memory cell, program a second memory cell of a second memory string in the subset after programming the first memory cell, and turn on the DSG transistor of the second memory string to verify the second memory cell including applying the pre-pulse stage to the second memory cell, wherein a first time interval between turning on the DSG transistor of the first memory string and applying a first verify voltage to a select word line is less than a second time interval between turning on the DSG transistor of the second memory string and applying the first verify voltage to the select word line.

11. The memory device of claim 10, further comprising:

DSG cut structures to isolate the DSG transistors of the memory strings from each other; and SSG cut structures to separate the memory strings into subsets of memory strings, wherein the SSG transistors of the memory strings in each subset are electrically coupled with each other, and the SSG transistors of the memory strings in different subsets are isolated by the SSG cut structures.

12. The memory device of claim 11, wherein the peripheral circuit is further configured to:

program a third memory cell in a third memory string in the subset after programming the first memory cell; and verify the third memory cell including applying the pre-pulse stage to the third memory cell.

13. The memory device of claim 12, wherein the peripheral circuit is further configured to:

turn on the SSG transistors of the subset of memory strings;

keep the SSG transistors of the memory strings other than the subset of memory strings off during verifying the first memory cell; and keep the DSG transistors of the memory strings other than the first memory string off during verifying the first memory cell;

apply a pass voltage to unselect word lines during verifying the first memory cell; and after the unselect word lines reaching the pass voltage, apply verify voltages to the select word line during verifying the first memory cell.

14. The memory device of claim 13, wherein the peripheral circuit is further configured to:

turn on the SSG transistors of the subset of memory strings;

turn on and turn off the SSG transistors of the memory strings other than the subset of memory strings during the pre-pulse stage of verifying the second memory cell; and turn on and turn off the DSG transistors of the memory strings other than the second memory string during the pre-pulse stage of verifying the second memory cell;

apply the pass voltage to unselect word lines in the pre-pulse stage verifying the second memory cell; and after the pre-pulse stage, apply verify voltages to the select word line during verifying the second memory cell.

15. The memory device of claim 14, wherein a first time period of the unselect word lines reaching the pass voltage during verifying the first memory cell is less than a second time period of the unselect word lines reaching the pass voltage during verifying the second memory cell.

16. The memory device of claim 10, wherein the peripheral circuit is further configured to:

provide a same voltage to the SSG transistors of the subset of memory strings that are coupled with each other.

17. The memory device of claim 10, wherein the first memory cell and the second memory cell are coupled with a same word line.

18. The memory device of claim 11, wherein the SSG cut structures are physical cut structures or electrical cut structures.

19. The method of claim 8, wherein the first verifying operation comprises:

turning on SSG transistors of a first subset of memory strings including the first memory string;

keeping SSG transistors of a second subset memory strings different from the first subset of memory strings off;

keeping the DSG transistors of the second subset memory strings;

applying a pass voltage to unselect word lines; and after the unselect word lines reaching the pass voltage, applying verify voltages to the word line.

20. The method of claim 19, wherein the second verifying operation comprises:

turning on the SSG transistors of the first subset of memory strings;

turning on the SSG transistors of the second subset memory strings in the pre-pulse stage; and turning on the DSG transistors of the second subset memory strings in the pre-pulse stage;

applying the pass voltage to the unselect word lines in the pre-pulse stage; and after the pre-pulse stage, applying the verify voltages to the word line.

* * * * *